United States Patent
Quitoriano et al.

(10) Patent No.: US 8,455,852 B2
(45) Date of Patent: Jun. 4, 2013

(54) CONTROLLED PLACEMENT OF DOPANTS IN MEMRISTOR ACTIVE REGIONS

(75) Inventors: Nathaniel J. Quitoriano, Pacifica, CA (US); Philip J. Kuekes, Menlo Park, CA (US); Jianhua Yang, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 60 days.

(21) Appl. No.: 13/142,583

(22) PCT Filed: Jan. 26, 2009

(86) PCT No.: PCT/US2009/000516
§ 371 (c)(1),
(2), (4) Date: Jun. 28, 2011

(87) PCT Pub. No.: WO2010/085225
PCT Pub. Date: Jul. 29, 2010

(65) Prior Publication Data
US 2011/0266510 A1    Nov. 3, 2011

(51) Int. Cl.
*H01L 29/02*    (2006.01)
(52) U.S. Cl.
USPC ..... 257/2; 257/3; 257/4; 257/5; 257/E29.002; 438/102; 438/103; 438/104; 365/163
(58) Field of Classification Search
USPC .... 257/2–5, E29.002; 438/102–104; 365/163
See application file for complete search history.

(56) References Cited

U.S. PATENT DOCUMENTS

| | | | |
|---|---|---|---|
| 3,843,949 A | 10/1974 | Plough et al. | |
| 3,937,989 A | 2/1976 | Meijer | |
| 3,972,059 A | 7/1976 | DiStefano | |
| 6,127,914 A | 10/2000 | Sasaki | |
| 6,780,683 B2 | 8/2004 | Johnson | |
| 7,220,983 B2 | 5/2007 | Lung | |
| 2003/0143790 A1 | 7/2003 | Wu | |
| 2003/0173612 A1 | 9/2003 | Krieger et al. | |
| 2005/0006640 A1 | 1/2005 | Jackson | |
| 2006/0043595 A1 | 3/2006 | Aratani et al. | |
| 2007/0221953 A1 | 9/2007 | Sakamoto | |
| 2008/0079029 A1 | 4/2008 | Williams | |
| 2008/0090337 A1 | 4/2008 | Williams | |
| 2008/0239797 A1 | 10/2008 | Tsukamoto et al. | |
| 2008/0265235 A1 | 10/2008 | Kamigaichi et al. | |
| 2011/0266510 A1 * | 11/2011 | Quitoriano et al. | 257/2 |

OTHER PUBLICATIONS

"nonvolatile" Merriam-Webster Online Dictionary. 2012, http://www.merriam-webster.com (4 Nov. 4, 2012).*
PCT International Search Report, Application No. PCT/US2009/000516, Report dated Aug. 28, 2009.
Driscoll, Tom, et al. "Phase-transition driven memristive system." Applied Physics Letters 95.4 (2009): 043503-043503.
PCT International Search Report, Application No. PCT/US2009/000518, Report dated Jun. 29, 2009.
PCT International Search Report, Application No. PCT/US2009/050277, Report dated Apr. 12, 2010.

* cited by examiner

*Primary Examiner* — Jami M Valentine

(57) ABSTRACT

Various embodiments of the present invention are direct to nanoscale, reconfigurable memristor devices. In one aspect, a memristor device (500,600) comprises an active region (508, 610) sandwiched between a first electrode (301) and a second electrode (302). The active region including a non-volatile dopant region (506,608) selectively formed and positioned within the active region.

20 Claims, 10 Drawing Sheets

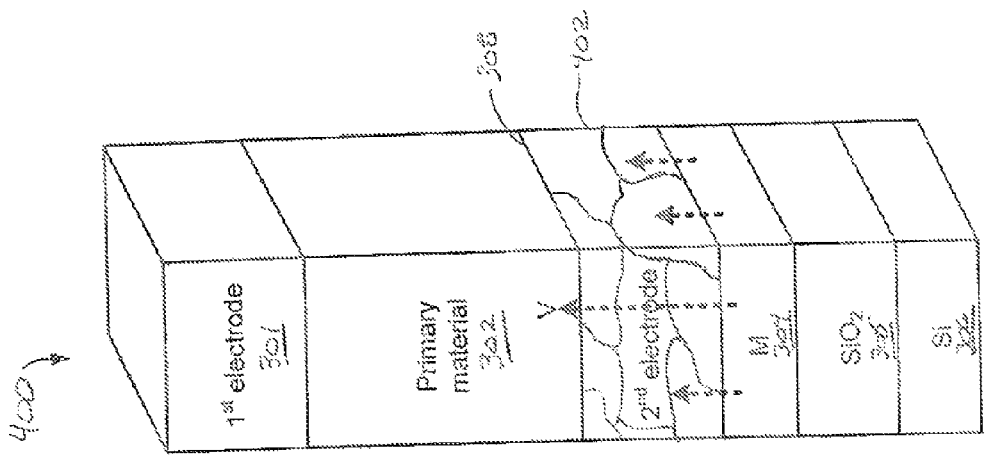
Figure 4
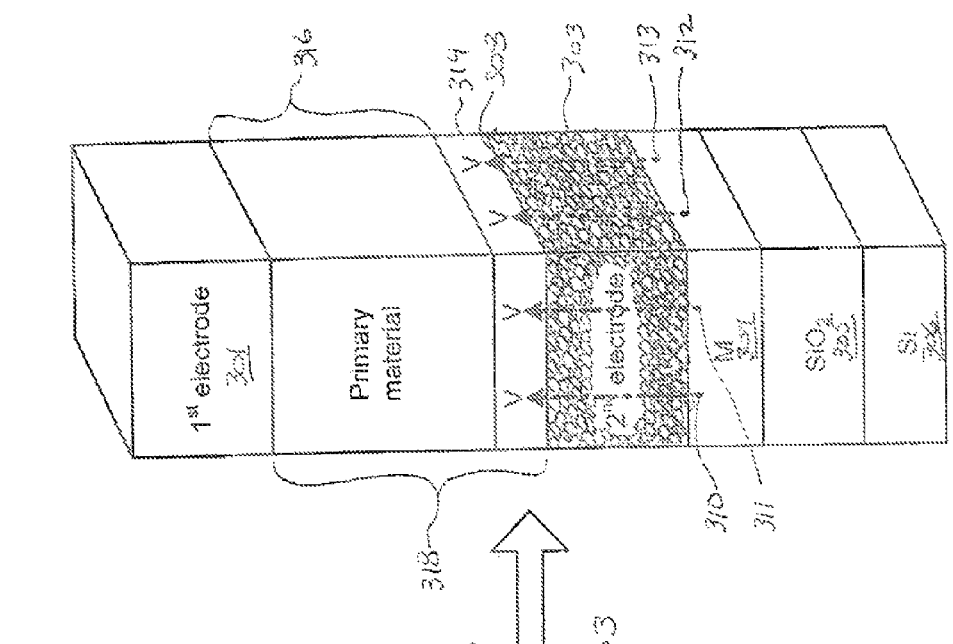
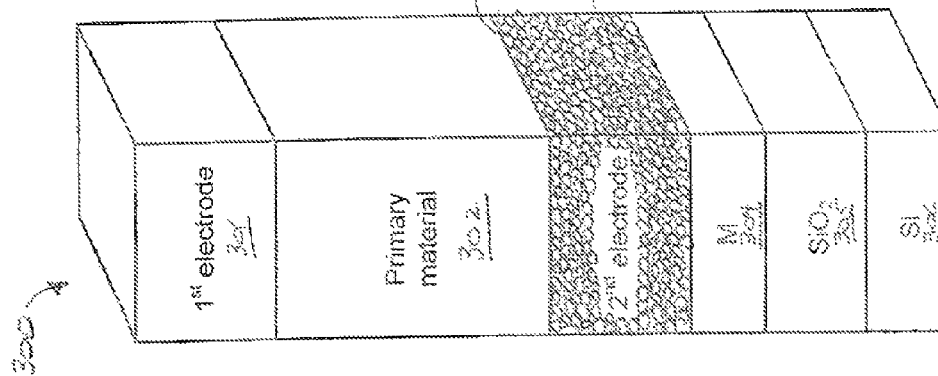
Figure 5

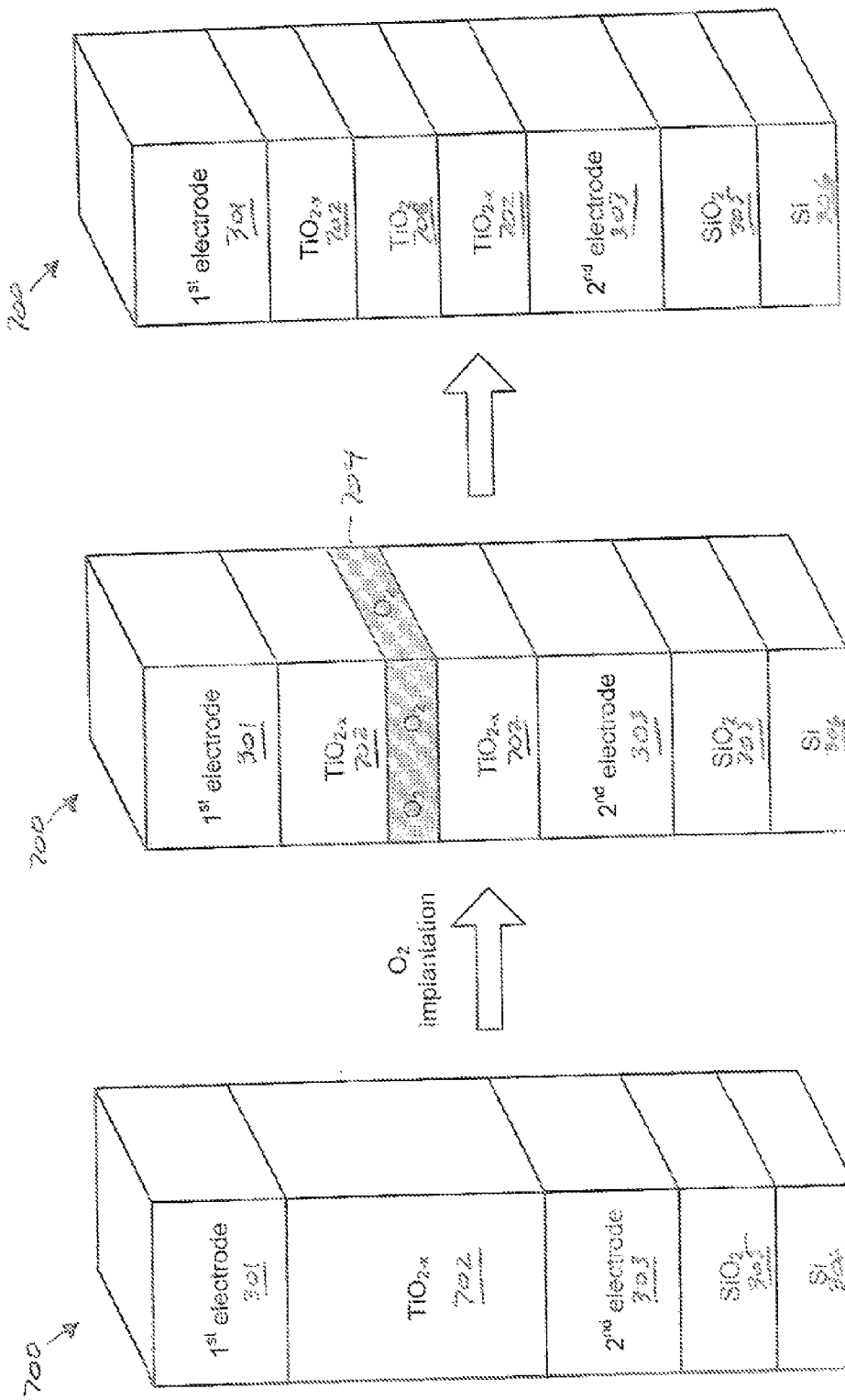

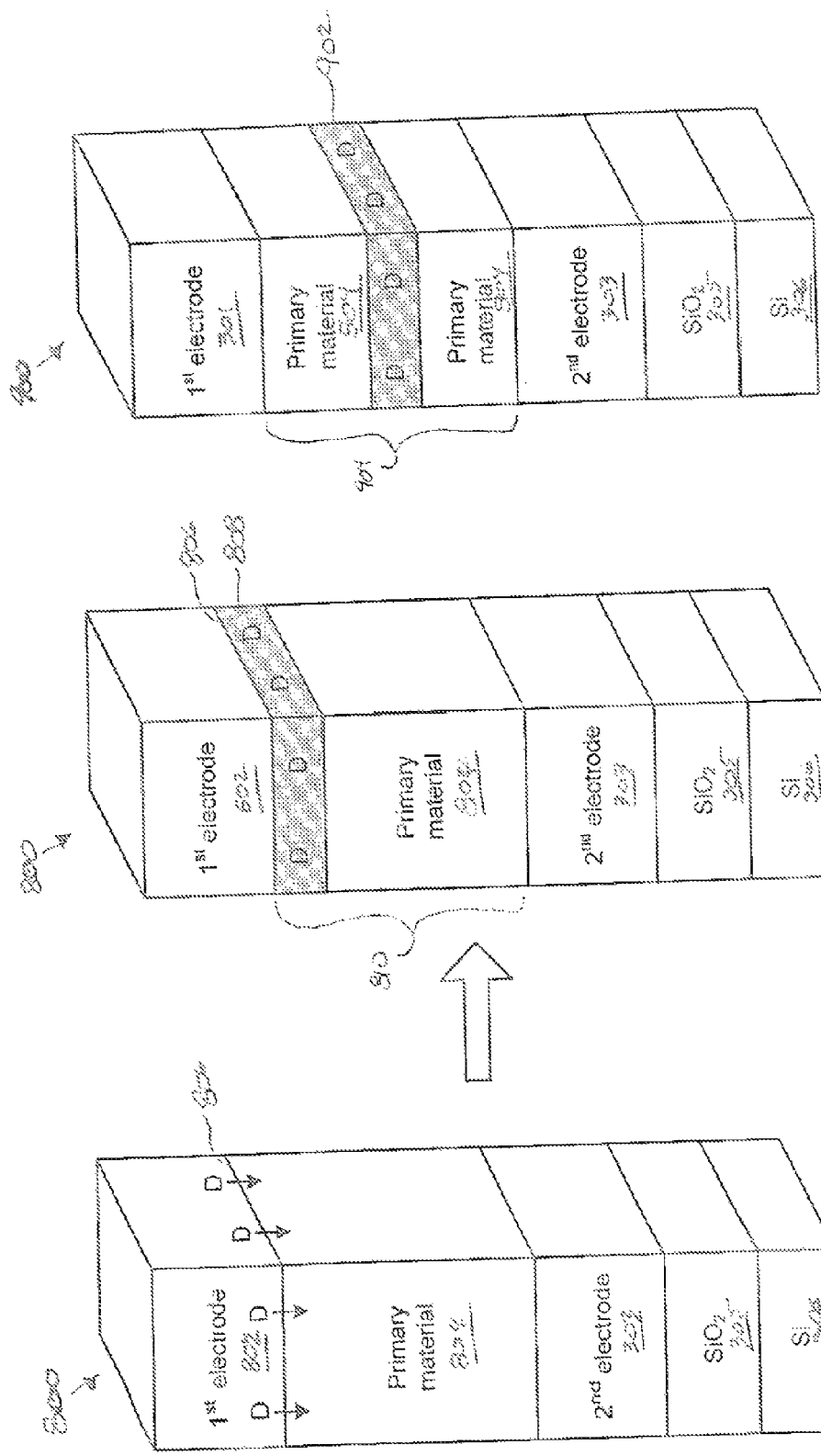

CONTROLLED PLACEMENT OF DOPANTS IN MEMRISTOR ACTIVE REGIONS

TECHNICAL FIELD

Embodiments of the present invention are related to nanoscale memristor devices.

BACKGROUND

Significant research and development efforts are currently directed towards designing and manufacturing nanoscale electronic devices, such as nanoscale memories. Nanoscale electronics promises significant advances, including significantly reduced features sizes and the potential for self-assembly and for other relatively inexpensive, non-photolithography-based fabrication methods. However, the design and manufacture of nanoscale electronic devices present many new problems compared with the current state-of-the-art.

Studies of switching in nanometer-scale transition-metal devices have previously reported that these devices could be reversibly switched and had an "on-to-off" conductance ratio of $\sim 10^3$. These devices have been used to construct crossbar circuits and provide a promising route for the creation of ultra-high density non-volatile memory. A series connection of crossbar switches that can be used to fabricate, for example, latch circuit elements has also been demonstrated, which is an important component for logic circuits and for communication between logic and memory. New logic families that can be constructed entirely from crossbar arrays of resistive switches or as hybrid structures composed of resistive switches and transistors have been described. These new logic families have the potential to dramatically increase the computing efficiency of CMOS circuits, thereby enabling performance improvements of orders of magnitude without having to shrink transistors, or to even replace CMOS for some applications if necessary. However, it is desired to improve the performance of the devices that are presently fabricated.

BRIEF DESCRIPTION OF THE DRAWINGS

FIG. 3 shows layers and formation of an ideal memristor device.

FIG. 4 shows enlarged grains comprising a second electrode of a second memristor device.

FIG. 7 shows a third memristor device configured in accordance with embodiments of the present invention.

FIG. 8 shows a fourth memristor device configured in accordance with embodiments of the present invention.

FIG. 9 shows a fifth memristor device configured in accordance with embodiments of the present invention.

DETAILED DESCRIPTION

Various embodiments of the present invention are directed to nanoscale, electronic devices, which are nonvolatile and combine reconfigurable diode rectifying states with memristive switching. A memristor device configured in accordance with embodiments of the present invention is composed of an active region sandwiched between two electrodes. The two interfaces between the active region and the electrodes are Schottky-like contacts. This multilayered junction is a diode that can be switched into one of four different rectifying states by applying an electrical field of an appropriate magnitude and polarity across the active region. The electric field changes the electrostatic potential distribution near the interfaces to have Ohmic-like barriers and/or Schottky-like barriers, thus enabling the active region to be re-configured so the device can operate as one of the following four types of rectifiers: a forward rectifier, a reverse rectifier, a shunted rectifier, and a head-to-head rectifier. The active region remains in a particular rectifying state provided operating voltages applied to the device do not exceed the magnitude of the electric field used to switch the rectifying state of the active region.

The active region is likely operated by positioning and repositioning dopants, which modify the electrical conductivity of the active region. Traditionally dopants are formed in the active region via chemical agents that thermally diffuse through one of the electrodes to an interface between the electrode and the active region. However, the grains comprising the electrode can be too large to allow a sufficient amount of agents to reach the interface. As a result, dopants fail to form in sufficient concentrations. In addition, the amount and distribution of the formed dopants are random and difficult to control. Embodiments of the present invention are directed to memristor devices with an active region that includes a selectively and controllably implanted dopant region or a selectively and controllably implanted material that forms a dopant region within the active region.

The detailed description is organized as follows: A description of electronically actuated devices is provided in a first subsection. A description of switching the rectifying state of the devices is provided in a second subsection. Various materials that can be used to fabricate the devices are provided in a third subsection. An example implementation of the devices in crossbar arrays is provided in a fourth subsection.

I. An Electronically Actuated Device

Figure 1A:
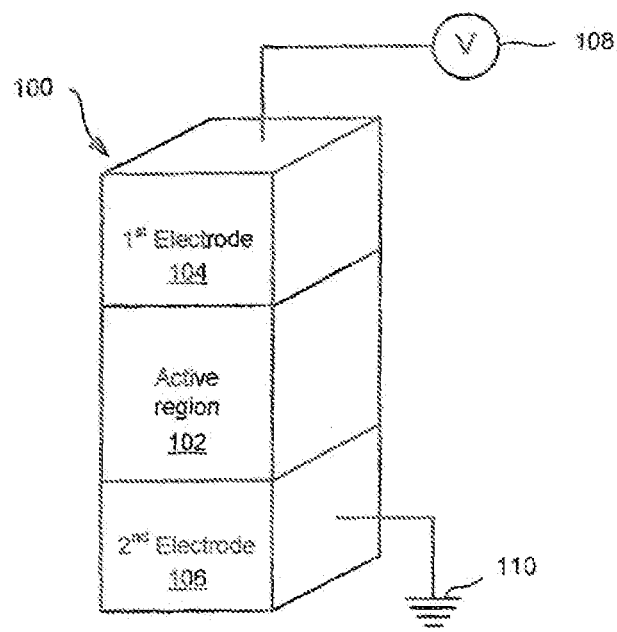
FIG. 1A shows a memristor device configured in accordance with embodiments of the present invention.

FIG. 1A shows a memristor device 100 configured in accordance with embodiments of the present invention. The device 100 is composed of three layers: an active region 102 sandwiched between a first electrode 104 and a second electrode 106. The first electrode 104 is connected to a voltage source 108 and the second electrode is connected to a ground 110. The active region 102 is a diode that includes a dopant. Applying an electric field of an appropriate magnitude and polarity changes the position of the dopant. As a result, the active region 102 can be operated as one of the four different types of rectifiers: a forward rectifier, a reverse rectifier, a head-to-head rectifier, and a shunted rectifier.

Figure 1B:
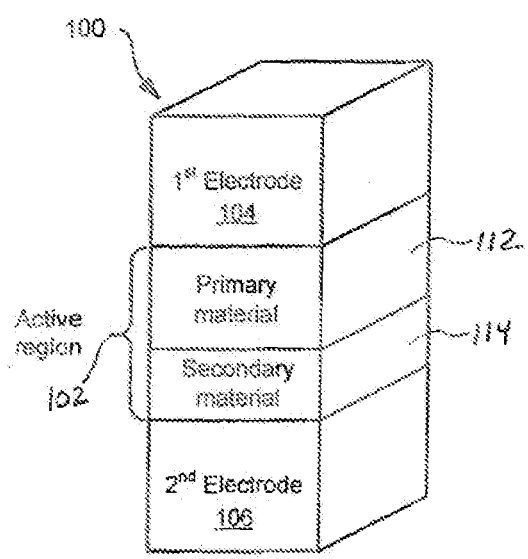
FIG. 1B shows primary and secondary active material layers in an active region of a memristor device condifigured in accordance with embodiments of the present invention.

FIG. 1B shows the active region 102 is composed of a primary active region or layer 112, and a secondary active region or layer 114 in accordance with embodiments of the present invention. The primary active region 112 comprises a thin film of a material that is electronically semiconducting or nominally electronically insulating and can also be a weak ionic conductor. The primary active material is capable of transporting and hosting ions that act as dopants in order to control the flow of electrons or current through the device 100. On the other hand, the secondary active material comprising the secondary active region 114 typically comprises a film within the active region that is a source of dopants for the primary active material. These dopants may be impurity atoms such as hydrogen or some other cation, such as alkali or transition metals, that acts as electron donors for the primary active material. Alternatively, the dopants can be anion vacancies, which in the primary active material are charged and therefore are also electron donors for the lattice of the active region 102. It is also possible to drive the anions into the primary active material, which become electron acceptors or hole donors.

The basic mode of operation is to apply an electrical field of an appropriate magnitude and polarity across the active region 102. When the magnitude and polarity of the electrical field, also called a "drift field," exceeds a threshold, the dopants become mobile in the primary active material, and the dopants can drill into or out of the primary active material via ionic transport from the secondary material. The ionic species are specifically chosen from those that act as electrical dopants for the primary active material, and thereby change the resistance of the primary active material. For example, applying a drift field that introduces dopants from the secondary active material into the primary active material lowers the resistance of the primary active material, while applying a drift field that drives dopants from the primary active material into the secondary active material increases the resistance of the primary active material. In addition, the primary active material and the dopants are chosen such that the drift of the dopants into or out of the primary active material is possible but not too facile that dopants can diffuse into or out of the primary active material when no voltage is applied. Some diffusion resistance is required to ensure that the active region 102 remains in a particular rectifying state for a reasonable period of time, perhaps for many years at room temperature. This ensures that the active region 102 is nonvolatile because the active region 102 retains its rectifying state even after the drift field has been removed. Applying a drift field with a large enough magnitude causes both electron current and dopants to drift, whereas applying operating voltages with lower relative voltage magnitudes than the drift field causes negligible dopant drift enabling the device to retain its rectifying state during operation.

The device 100 is a memristor because the resistance changes in a non-volatile fashion depending on the amount and distribution of charge in the device. Memristance is a non-volatile, charge-dependent resistance denoted by m(q). The term "memristor" is short for "memory resistor." Memristors are a class of passive circuit elements that maintain a functional relationship between the time integrals of current and voltage. This results in resistance varying according to the device's memristance function. Specifically engineered memristors provide controllable resistance useful for switching current. The memristor is a special ease in so-called "memristive systems," described as a class of mathematical models useful for certain empirically observed phenomena, such as the firing of neurons. The definition of the memristor is based solely on fundamental circuit variables, similar to the resistor, capacitor, and inductor. Unlike those more familiar elements, the necessarily nonlinear memristors may be described by any of a variety of time-varying functions. As a result, memristors do not belong to Linear Time-independent circuit models. A linear time-independent memristor is simply a conventional resistor.

A memristor is a element in which the 'magnetic flux' (defined as an integral of bias voltage over time) $\Phi$ between the terminals is a function of the amount of electric charge q that has passed through the device. Each memristor is characterized by its memristance function describing the charge-dependent rate of change of flux with charge as follows:

$$m(q) = \frac{d\Phi}{dq}$$

Based on Faraday's law of induction that magnetic flux $\Phi$ is the time integral of voltage, and charge q is the time integral of current, the memristance can be written as $$m(q) = \frac{V}{I}$$

Thus, as stated above, the memristance is simply nonvolatile charge-dependent resistance. When m(q) is constant, the memristance reduces to Ohm's Law R=V/I. When m(q) is not constant, the equation is not equivalent to Ohm's Law because q and m(q) can vary with time. Solving for voltage as a function of time gives:

$$V(t) = m[q(t)]I(t)$$

This equation reveals that memristance defines a linear relationship between current and voltage, as long as charge does not vary. However, nonzero current implies instantaneously varying charge. Alternating current may reveal the linear dependence in circuit operation by inducing a measurable voltage without net charge movement, as long as the maximum change in q does not cause change in m. Furthermore, the memristor is static when no current is applied. When I(t) and V(t) are 0, m(t) is constant. This is the essence of the memory effect.

The material comprising the primary active layer 112 can be single crystalline, poly-crystalline, nanocrystalline, nanoporous, or amorphous. The mobility of the dopants in nanocrystalline, nanoporous or amorphous materials, however, is much higher than in bulk crystalline material, since drift can occur through grain boundaries, pores or through local structural imperfections in a nanocrystalline, nanoporous, or amorphous material. Also, because the primary active material is relatively thin, the amount of time needed for dopants to drift into or out of the primary active material enables the primary active materials conductivety to be rapidly changed. For example, the time needed for a drift process varies as the square of the distance covered, so the time to drift one nanometer is one-millionth the time to drift one micrometer.

The primary active layer 112 and the secondary active layer 114 are contacted on either side by metal electrodes 104 and 106, or one of the electrodes can be composed of a semiconductor material and the other a metal. When the active region 102 is composed of a semiconductor material, the contact between a metal electrode and the active region 102 depletes the active region 102 of free charge carriers. Thus, the net charge of the active region 102 depends on the identity of the dopant and is positive in the case of electron donors and negative in the case of electron acceptors.

The ability of the dopant to drift in and out of the primary active material is substantially improved if one of the interfaces connecting the active region 102 to a metal or semiconductor electrode is non-covalently bonded. Such an interface may be composed of a material that does not form covalent bonds with the electrode, the primary active material, or both. This non-covalently bonded interface lowers the activation energy of the atomic rearrangements that are needed for drift of the dopants in the primary active material. This interface is essentially an extremely thin insulator, and adds very little to the total series resistance of the device.

One potentially useful property of the primary active material is that it can be a weak ionic conductor. The definition of a weak ionic conductor depends on the application for which the device 100 is designed. The mobility $\mu_d$ and the diffusion constant D for a dopant in a lattice are related by the Einstein equation:

$$D=\mu_d kT$$

where k is Boltzmann's constant, and T is absoulte temperature. Thus, if the mobility $\mu_d$ of a dopant in a lattice is high so is the diffusion constant D. In general, it is desired for the active region 102 of the device 100 to maintain a particular rectifying state for an amount of time that may range from a fraction of a second to years, depending on the application. Thus, it is desired that the diffusion constant D be low enough to ensure a desired level of stability, in order to avoid inadvertently turning the active region 102 from one rectifier to another rectifier via ionized dopant diffusion, rather than by intentionally setting the state of the active region 102 with an appropriate voltage. Therefore, a weakly ionic conductor is one in which the dopant mobility $\mu_d$ and the diffusion constant D are small enough to ensure the stability or non-volatility of the active region 102 for as long as necessary under the desired conditions. On the other hand, strongly ionic conductors would have relatively larger dopant mobilities and be unstable against diffusion.

II. Non-volatile Memristive Switching of the Device

In certain embodiments, the active region 102 can be operated so that Ohmic and Shottky barriers are created to control the flow of charge carriers through the active region 102. However, the traditional description of electrode/semiconductor Schottky and Ohmic barriers does not apply to a nanoscale device 100 because the materials comprising the electrodes 104 and 106 and the active region 102 are structured at the nanoscale. As a result, the structural and electronic properties are not averaged over the large distances for which the theory of metal-semiconductor contacts is developed. Instead, the electronic properties of undoped electrode/active region interfaces can electronically resemble Schottky barriers and are called "Schottky-like barriers," and the electronic properties of doped electrode/semiconductor interfaces electronically resemble Ohmic barriers and are called "Ohmic-like barriers."

Figure 2A:
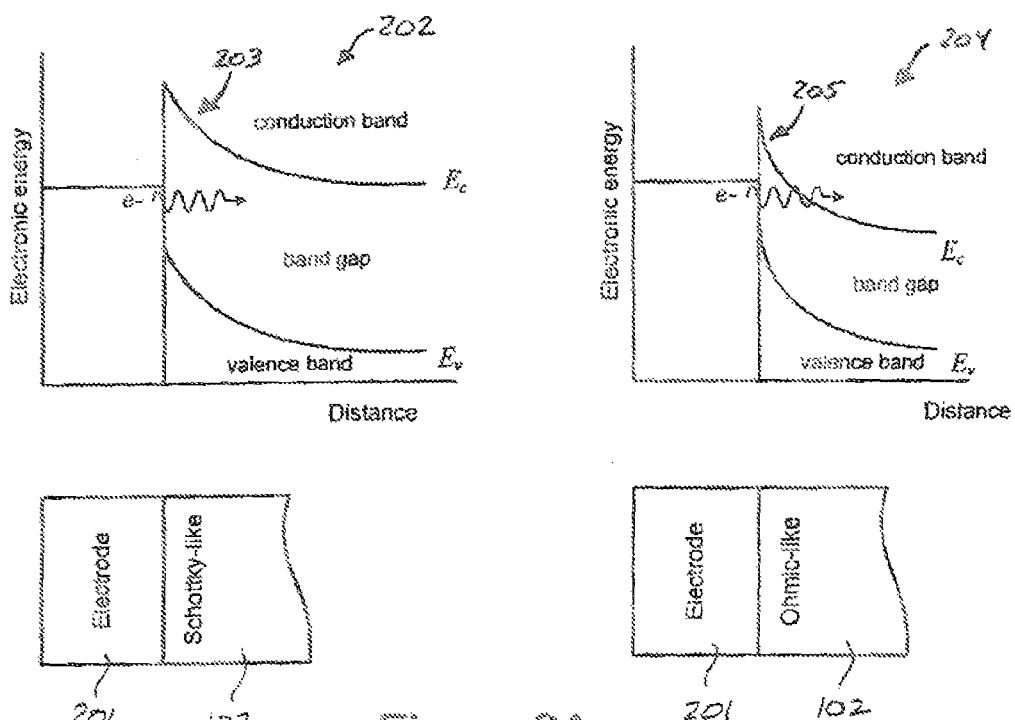
FIG. 2A shows electronic band diagrams representing electronic properties of Schottkly-like and Ohmic-like barriers at an electrode and active region interface in accordance with embodiments of the present invention.

Conduction of electrons through the active region 102 occurs via quantum mechanical tunneling through the Ohmic-like barrier. FIG. 2A shows electronic band diagrams that represent the electronic properties of Schottky-like and Ohmic-like barriers at an electrode 201/active region 102 interface in accordance with embodiments of the present invention. As shown in band diagram 202, when the active region 102 near an electrode 201 has a low dopant concentration or is essentially intrinsic, the tunneling barrier is a Schottky-like barrier 203, which can be characterized as high and wide and electrons cannot tunnel into the conduction band of the active region 102. Thus, the conductivity through the active region 102 is low and the device 100 is in the "off" state. On the other hand, as shown in band diagram 204, when a sufficient number of dopants have been moved into the active region 102 near one of the electrodes 201, the tunneling barrier is an Ohmic-like barrier 205 and the width and perhaps the height of the tunneling barrier are dimished, electrons tunnel into the conduction band of the active region 102, which results in an increase in the conductivity, and the device 100 is in the "on" state.

Figure 2B:
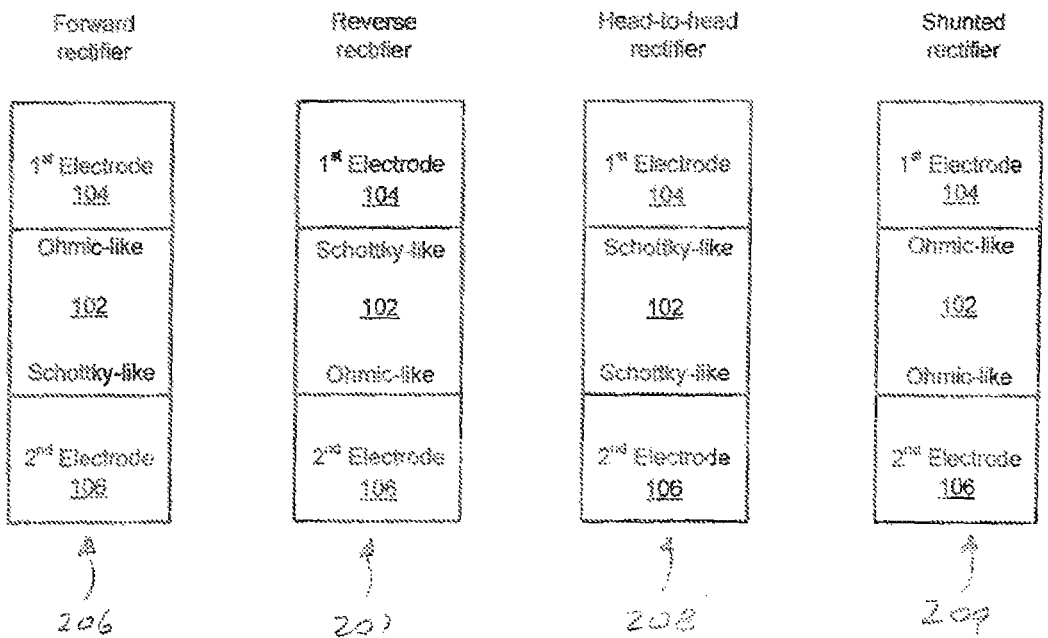
FIG. 2B shows profiles of tunneling barriers associated with four rectifiers configured in accordance with embodiments of the present invention.

Each of the four rectifiers corresponds to a different dopant distribution. When the dopant is located at or near an electrode/active region interface, the interface has an Ohmic-like harrier. Thus, charge carriers can readily tunnel through the Ohmic-like barrier into and out of the active region 102. On the other hand, an undoped portion of the active region 102 at or near an electrode/active region interface has a Schottky-like barrier that is either too high or wide to permit most charge carriers from tunneling through the active region 102. FIG. 2B shows the relative locations of the Ohmic-like and Schottky-like barriers associated with each of the four rectifiers in accordance with embodiments of the present invention. A forward rectifier 206 and a reverse rectifier 207 have Ohmic-like harriers and Schottky-like harriers located at opposite interfaces. A head-to-head rectifier 208 is characterized by having the dopants distributed within the active region 102 leaving Schottky-like barriers at both interfaces. On the other hand, a shunted rectifier 209 is characterized by having dopants located at or near both interfaces creating Ohmic-like barriers at both interfaces.

Figure 2C:
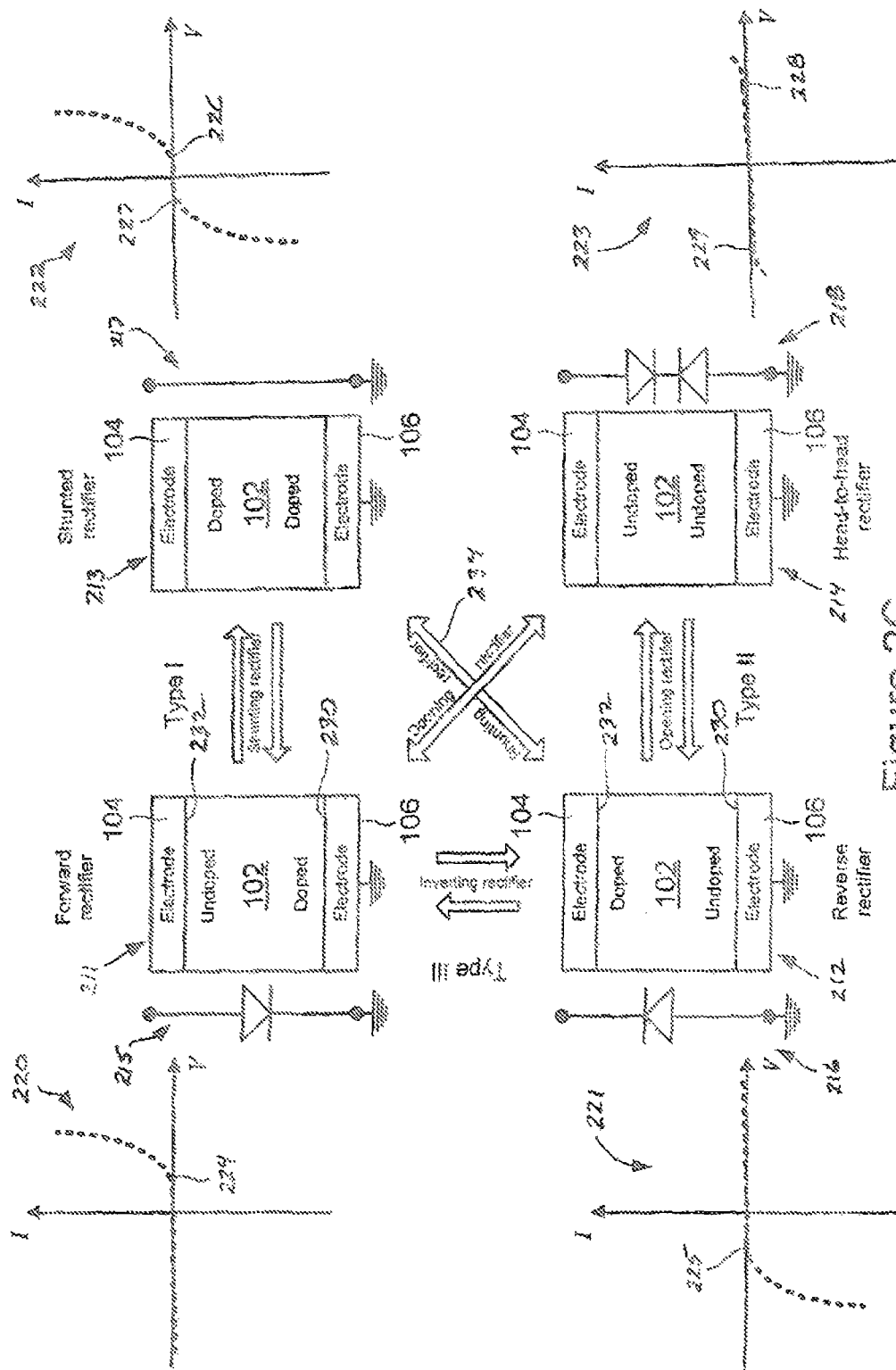
FIG. 2C shows plots of current-versus-voltage curves associated with the four rectifiers shown in FIG. 2B and three modes of switching between pairs of the rectifiers in accordance with embodiments of the present invention.

FIG. 2C shows schematic profiles of the four rectifiers 211-214 of the active region 102 and three modes of switching between pairs of rectifiers in accordance with embodiments of the present invention. In addition to the four rectifiers 211-214, FIG. 2C includes circuit diagrams 215-218 and I-V characteristic plots 220-223 that are associated with each of the four rectifiers 211-214. Each of the four rectifiers 211-214 of the device 100 represents a different profile distribution of dopants, and therefore, has a different associated I-V characteristic represented in each of the plots 220-223. Electrode/active region contacts are typically Ohmic-like in the case of heavy doping, and rectifying or Schottky-like in the case of low doping. Thus, the concentration of dopants at an interface determines the electronic behavior, and therefore, the transport of charge carriers through the active region 102. The four different rectifiers 211-214 are identified as a forward rectifier, a reverse rectifier, a shunted rectifier, and a head-to-head rectifier, respectively, and were described above with reference to FIG. 2B. The rectifying state properties of each of these rectifiers depend on the distribution of dopants within the active region 102.

The plots 220-223 of the I-V characteristic curves reveal the response of the device 100 to different operating voltage polarities and magnitudes. In particular, plot 220 reveals that when the device 100 is configured as the forward rectifier 211, current flows from the first electrode 104 to the second electrode for positive polarity voltages exceeding a voltage 224 and resistance is large for negative polarity voltages. Plot 221 reveals that when the device 100 is configured as the reverse rectifier 212, current flows from the second electrode 106 to the first electrode 104 for negative polarity voltages exceeding a voltage 225 and resistance is large for positive polarity voltages. Plot 222 reveals that when the device 100 is configured as the shunted rectifier 213, current substantially flows undisturbed through the device 100 for positive and negative polarity voltages with magnitudes exceeding voltages 226 and 227. Finally, plot 223 reveals that when the device 100 is configured as a head-to-head rectifier 214, the resistance of the device 100 is high for positive and negative polarity voltages between voltages 228 and 229. Note that plots 220-223 show only operating voltage ranges. In other words, the magnitudes of voltages applied to the rectifiers 211-214 represented in plots 220-223 are not large enough to change the rectifier to a different rectifier or destroy the device 100.

The dopants are mobile under an appropriate drift field because the active region 102 may only be a few nanometers thick. The reconfiguration of the dopant profiles due to the drift of dopants under a drift field leads to electrical switching between the four rectifiers. As shown in FIG. 2C, shunting is switching between the forward rectifier 211 and the shunted rectifier 213. In this switching, interface 230 is heavily doped and remains Ohmic-like with negligible changes during the electrical biasing. A bias with an appropriate polarity and magnitude on the first electrode 104 attracts a portion of the dopants to the interface 232, switching the device from the forward rectifier 211 to the shunted rectifier 213. A bias with an opposite polarity and approximately the same magnitude switches the shunted rectifier 213 back to the forward rectifier 211. Of course, the switching between the reverse rectifier 212 and the shunted rectifier 213 also belongs to this type of switching, indicated by diagonal arrow 234.

Opening is switching between the reverse rectifier 212 and the head-to-head rectifier 214. In this case, the undoped interface 230 remains unchanged and only the doped interface 232 is switched. The undoped interface contains few dopants and remains rectifying instead of Ohmic-like. A bias of an appropriate polarity and magnitude on the first electrode 104 forces dopants away from the interface 232 and switches the reverse rectifier 212 into the head-to-head rectifier 214, and vice versa. The switching between the forward rectifier 211 and the back-to-back rectifier 214 is also opening.

Inverting between the forward rectifier 211 and the reverse rectifier 212 involves simultaneously applying oppositely polarized biases to the electrodes 104 and 106. For example, switching from the forward rectifier 211 to the reverse rectifier 212 is accomplished by applying oppositely polarized biases to the electrodes 104 and 106 to force dopants away from the interface 230 and attract dopants to the interface 232. Switching from the reverse rectifier 212 to the forward rectifier 211 is accomplished by applying oppositely polarized biases to the electrodes 104 and 106 to force dopants away from the interface 232 and attract dopants to the interface 230. Therefore, the dopant profile across the active region 102 is essentially inverted and so is the rectifying orientation, resulting in a switching between a reverse rectifier and a forward rectifier.

III. Device Composition and Operation

The material of the primary active layer 112 can be composed of an oxide having at least one oxygen atom ("O") and at least one other element. In particular, the primary active layer 112 can be composed of any of titania ("$TiO_2$"), zirconia ("$ZrO_2$"), and hafnia ("$HfO_2$"). These materials are compatible with silicon ("Si") integrated circuit technology because they do not create deep level dopants in Si. Other composition embodiments for the active region 102 include alloys of these oxides in pairs or with all three of the elements Ti, Zr, and Hf present. For example, the primary active layer can be composed of $Ti_xZr_yHf_zO_2$, where x+y+z=1. Related compounds include titanates, zirconates, and hafnates. For example, titanates includes $ATiO_3$, where A represents one of the divalent elements strontium ("Sr"), barium ("Ba") calcium ("Ca"), magnesium ("Mg"), zinc ("Zn"), and cadmium ("Cd"). In general, the primary active layer can be composed of $ABO_3$, where A represents a divalent element and B represents Ti, Zr, and Hf. The primary active layer can also be composed of alloys of these various compounds, such as $Ca_aSr_bBa_cTi_xZr_yHf_zO_3$, where a+b+c=1 and x+y+z=1. There are also a large variety of other oxides of the transition and rare earth metals with different valences that may be used, both individually and as more complex compounds. In each case, the mobile dopant is an oxygen vacancy, denoted by $V_O$. An oxygen vacancy effectively acts as a positively charged n-type dopant with one shallow and one deep energy level. For example, because even a relatively minor nonstoichiometry of about 0.1% oxygen vacancies in $TiO_{2-x}$ is approximately equivalent to $5 \times 10^{19}$ dopants/cm$^3$, modulating oxygen vacancy profiles have strong effect on electron transport.

In other embodiments, the primary active layer can be composed of a nitride having at least one nitrogen atom and at least one other element. For example, the primary active layer can be composed of but is not limited to, $Si_3N_4$, $Be_3N_2$, $P_3N_5$, TiN, $Li_3N$, and a large variety of other nitrides. The mobile dopant can be a nitrogen vacancy.

In other embodiments, the primary active layer can be composed of a sulfide having at least one sulfur atom and at least one other element. For example, the primary active layer can be composed, but is not limited to, CdS, PbS, ZnS, $CS_2$, and a large variety of other sulfides. The mobile dopant can be a sulfur vacancy.

In other embodiments, the primary active layer can be composed of a carbide having at least one carbon atom and at least one other element. For example, the primary active layer can be composed, but is not limited to, $Na_2C_2$, $CaC_2$, $LaC_2$, $Li_4C_3$, $Mg_2C_3$, $B_4C$, SiC, and a large variety of other carbides. The mobile dopant can be a carbon vacancy.

The electrodes 104 and 106 can be composed of platinum, gold, copper, tungsten, or any other suitable metal, metallic compound (e.g. some perovskites such as $BaTiO_3$ and $Ba_{1-x}La_xTiO_3$, $PrCaMnO_3$) or semiconductor.

Note that in the following description "M" represents one of the following materials: Ti, Hf, Zr, $Ti_xZr_yHf_z$, ATi, AB, and $Ca_aSr_bBa_cTi_xZr_yHf_z$ described above, and any other non-oxygen portion of an oxide, any non-nitrogen portion of a nitride, any non-sulfur portion of a sulfide, or any non-carbon portion of a carbide. Also, the letter "V" represents a vacancy, such as an oxygen vacancy, a nitrogen vacancy, a sulfur vacancy, or carbon vacancy.

FIG. 3 shows the composition of layers traditionally employed in forming the primary and secondary active regions of an oxide-based active region of a memristor device 300. The device 300 comprises a first electrode 301 deposited on a primary active layer 302 which is deposited on a second electrode 303. The second electrode 303 is deposited on an M-layer 304 comprising a material M. The M-layer 304 is deposited on an insulation layer 305, such as $SiO_2$, which is deposited on a silicon layer 306. For the sake of illustration, the granular structure of the second electrode 303 is represented. Ideally the grains of the second electrode 303 are small enough for the material M to thermally diffuse through the second electrode 303 along the grain boundaries to an interface 308 between the primary active layer 302 and the second electrode 303, as indicated by directional arrows 310-313. The material M can also diffuse a short distance into the primary active layer 302. The material M located along the interface 308 reacts with the oxide creating a relatively high concentration of oxygen vacancies V in a region 314 near the second electrode 303. The region 314 corresponds to the secondary active layer of an active region 318.

However, in practice, the grains comprising the second electrode 303 may vary in size, and in many cases, the size of the grains may be large enough to prevent a sufficient amount of the material M from thermally diffusing into the interface 308. FIG. 4 shows enlarged grains comprising a second electrode 402 of a memristor device 400, where the pains of the second electrode 402 are large enough to prevent a sufficient amount of the material M from reaching the interface 308. As a result, only a small fraction of the oxygen vacancies needed to create a secondary active region of oxygen vacancies actually forms near the interface 308, the secondary active layer fails to fully form, and the device 400 is rendered inoperable.

Figure 5A:
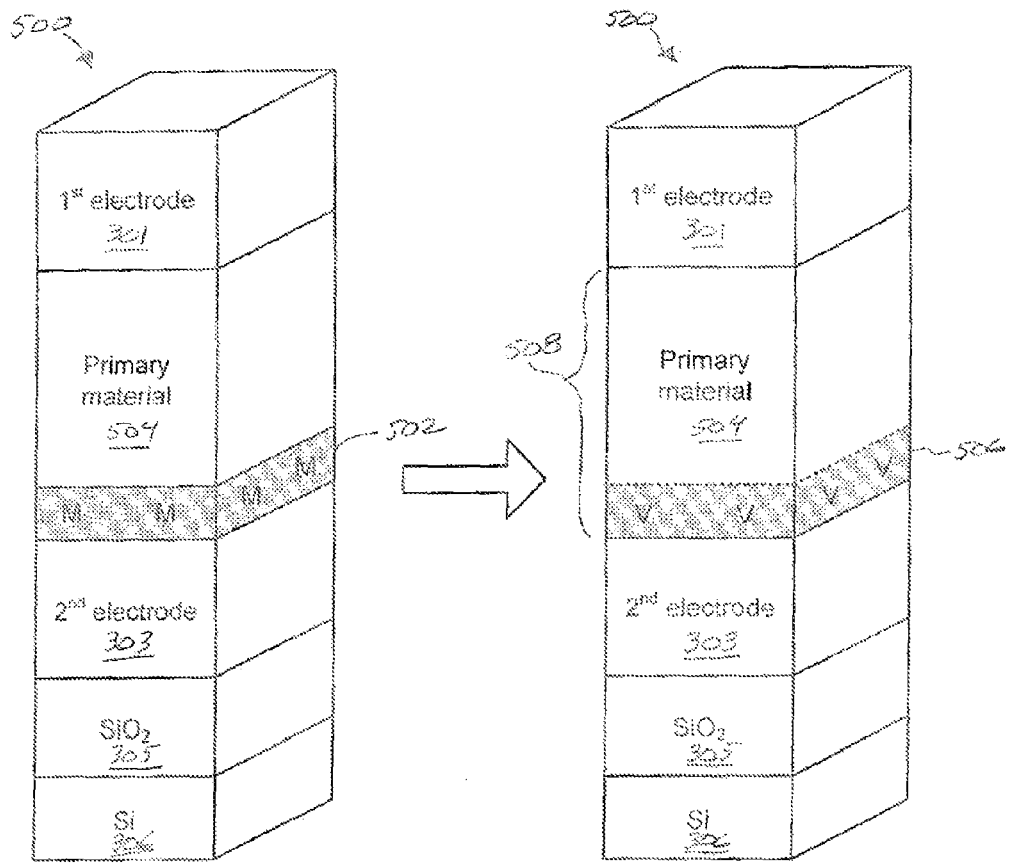
FIG. 5A shows a first memristor device configured in accordance with embodiments of the present invention.

Certain embodiments of the present invention are directed to a material M implanted or diffused into the primary active layer. The material forms a corresponding secondary active layer with a high concentration of vacancies. FIG. 5A shows a memristor devite 500 with a vacancy region formed near an electrode in accordance with embodiments of the present invention. The vacancy region can be formed in a number of different ways. In certain embodiments, the device 500 can be formed by depositing the material M 502 on the second electrode 303 followed by depositing a primary active layer 504 over the material 502. In other embodiments, the material 502 can be implanted near the second electrode 303 within the primary active layer 504 using ion implantation. As shown in FIG. 5A, the material M reacts with the oxide material of the primary active layer 504 creating a relatively high concentration of vacancies within a region 506 adjacent to the second electrode 303. In still other embodiments, ion implantation can be used to implant the material M in either the first electrode 301 or the second electrode 303 forming an alloy electrode. Suppose, for example, the material M is ion implanted in the second electrode 303. The material M located at the interface between the second electrode 303 reacts with the oxide of the primary active layer 504 forming the region 506 adjacent to the second electrode 303. In other embodiments, the material M implanted in the second electrode 303 can diffuse from the second electrode 303 into the primary active layer 504 forming the region 506. The region 506 corresponds to the secondary active layer of an active region 508. The vacancies can then be distributed to form various rectifiers as described above with reference to FIG. 2. In other embodiments, the material M can be implanted within the top portion of the primary active layer 504 or within the first electrode 301 to form the region 506 between the first electrode 301 and the oxide layer 504. In other embodiments, a first amount of material M can be implanted near the first electrode and a second amount of material M can implanted near the second electrode to form a first vacancy region located adjacent to the first electrode 301 and a second vacancy region located adjacent to the second electrode 303.

Figure 5B:
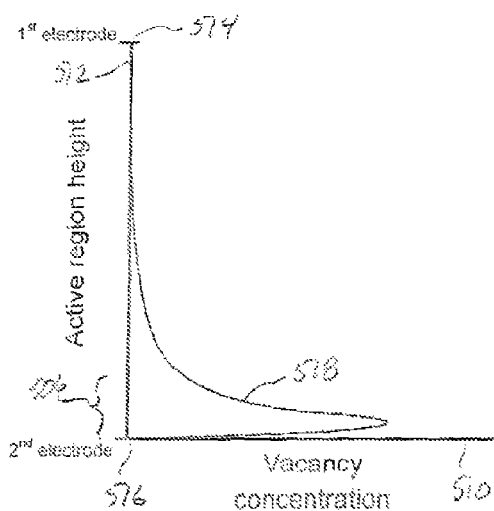
FIG. 5B shows a plot of oxygen vacancy concentration within an active region of the device shown in FIG. 5A in accordance with embodiments of the present invention.

FIG. 5B shows a plot of vacancy concentration within the active region 508 between the first and second electrodes 301 and 303 where the material M is implanted near the second electrode 303 in accordance with embodiments of the present invention. Axis 510 represents the concentration of vacancies, and axis 512 represents the height of the active region 510 between the first and second electrodes. Point 514 identifies the interface between the first electrode and the primary active layer 504, and point 516 identifies the interface between the second electrode 303 and the primary active layer 504. Curve 518 represents the concentration of vacancies between the electrodes 301 and 303 within the active region 508 shown in FIG. 5A. Curve 518 reveals a relatively high concentration of vacancies formed near the second electrode 502 corresponding to the region 506. Curve 518 also reveals that the concentration of vacancies rapidly decreases away from the region 506.

Figure 5C:
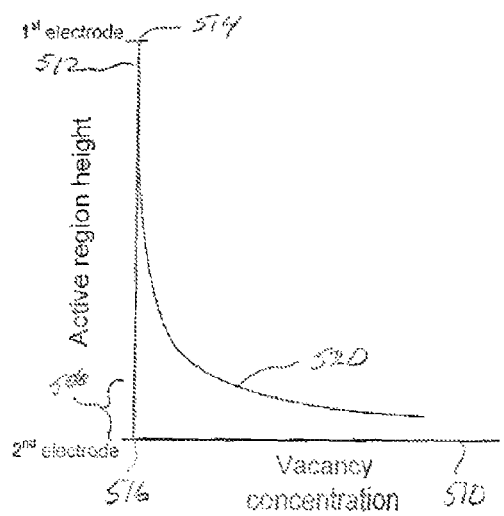
FIG. 5C shows a plot of vacancy concentration within an active region between a first electrode and a second electrode where a material is implanted in the second electrode in accordance with embodiments of the present invention.

FIG. 5C shows a plot of vacancy concentration within the active region 508 between the first and second electrodes 301 and 303 where the material M is implanted in the second electrode 303 in accordance with embodiments of the present invention. Curve 520 reveals a relatively high concentration of vacancies formed near and at the interface between the second electrode 502 and the primary active layer 504 corresponding to the region 506.

Figure 6A:
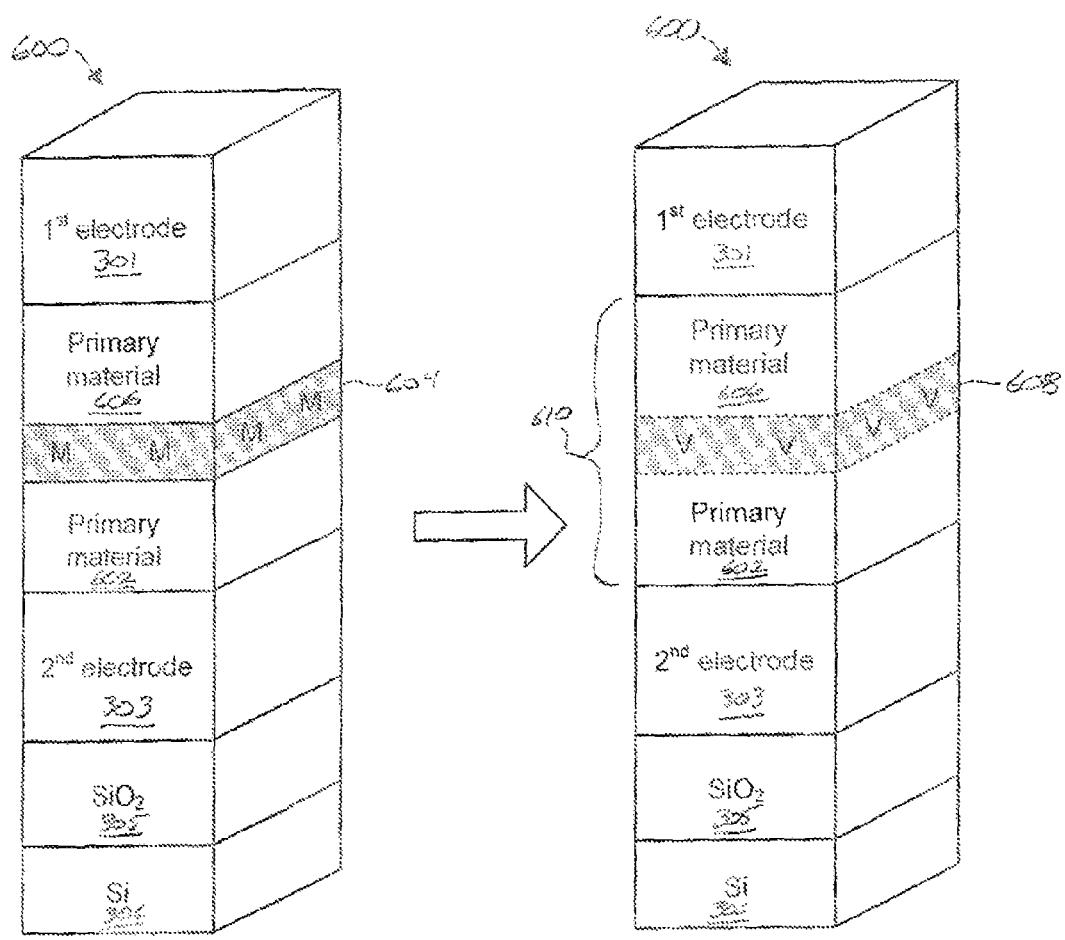
FIG. 6A shows a second memristor device configured in accordance with embodiments of the present invention.

In other embodiments, a vacancy region can be formed anywhere within the primary active layer and away from the first and second electrodes 301 and 303. FIG. 6A shows a memristor device 600 with a vacancy region formed within the active region in accordance with embodiments of the present invention. The device 600 is similar to the device 500 except the device 600 can be formed by depositing primary active layer material on the second electrode 303 followed by using ion implantation to implant a material M 604 within the primary active layer resulting in a first primary active layer 602 and a second primary active layer 606 sandwiching the material M 604. The material in the material M 604 reacts with the material comprising the adjacent primary active layers 602 and 606 forming a vacancy region 608 between the primary active layers 602 and 606. The region 608 corresponds to the secondary active layer of an active region 610.

Figure 6B:
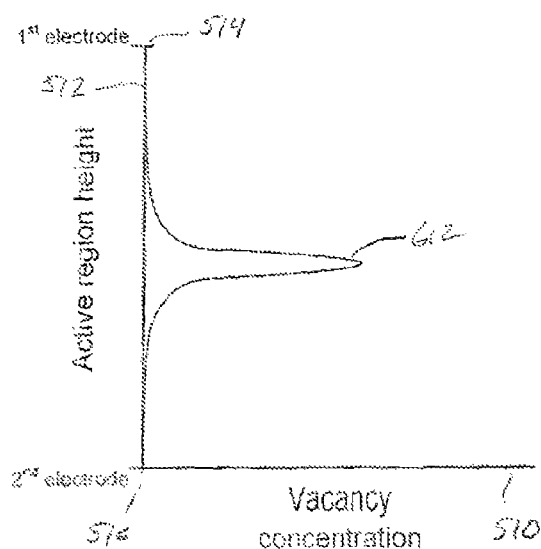
FIG. 6B shows a plot of oxygen vacancy concentration within an active region of the device shown in FIG. 6A in accordance with embodiments of the present invention.

FIG. 6B shows a plot of oxygen vacancy concentration within the active region 610 between the first and second electrodes 301 and 303 in accordance with embodiments of the present invention. Curve 612 reveals a relatively high concentration of vacancies produced near the center of active region 610 corresponding to the region 608. Curve 612 also reveals that the concentration of vacancies rapidly decreases away from the region 608 toward the first and second electrodes 301 and 303.

In other embodiments, implantation can also be used to implant a species that reduces vacancies in a layer composed of a material having a high initial concentration of vacancies: FIG. 7 shows a memristor device 700 with vacancy regions by implanting species that reduce vacancies in a $TiO_{2-x}$ layer in accordance with embodiments of the present invention. Initially, as shown in FIG. 7, a layer 702 is composed of a vacancy material $TiO_{2-x}$. Implantation is used to form an oxygen ("$O_2$") rich layer 704 within the $TiO_2$ layer 702. The oxygen forms a vacancy deficient $TiO_2$ layer 706 between $TiO_{2-x}$ layers 702. The $TiO_2$ layer 706 corresponds to a primary active layer and the layers $TiO_2$ layers 702 form secondary active layers. Note that in other embodiments, the oxygen layer 704 can be implanted anywhere within the $TiO_{2-x}$ layer. The same technique can be applied to nitrides, sulfides, and carbides.

Embodiments of the present invention are not limited to forming a single vacancy region, as described above with reference to FIGS. 5-6. In other embodiments, more than one material M can be implanted in the primary active layer between the electrodes 301 and 303, where the material M are each separated by primary active layer material.

In other embodiments, the material M located adjacent to the primary active layer 302 and the electrode interface can diffuse into the primary active layer and serve as the dopant.

In other embodiments, the primary active layer material can be a semiconducting nitride or a semiconducting halide. For example, semiconducting nitrides include AlN, GaN, ScN, YN, LaN, rare earth nitrides, and alloys of these compounds and more complex mixed metal nitrides, and semiconducting halides include CuCl, CuBr, and AgCl. The primary active layer material can also be a phosphide or an arsenide of various transition and rare earth metals. In all of these compounds, the mobile dopant in the secondary active layer can be an anion vacancy or an aliovalent element.

In other embodiments, the primary active layer 302 can also be composed of a semiconductor material including various combinations of direct and indirect semiconductors. The indirect and direct semiconductors can be elemental and compound semiconductors. Indirect elemental semiconductors include Si and germanium (Ge), and compound semiconductors include III-V materials, where Roman numerals III and V represent elements in the IIIa and Va columns of the Periodic Table of the Elements. Compound semiconductors can be composed of column IIIa elements, such as aluminum (Al), gallium (Ga), and indium (In), in combination with column Va elements, such as nitrogen (N), phosphorus (P), arsenic (As), and antimony (Sb). Compound semiconductors can also be further classified according to the relative quantities of III and V elements. For example, binary semiconductor compounds include semiconductors with empirical formulas GaAs, InP, InAs, and GaP; ternary compound semiconductors include semiconductors with empirical formula $GaAs_yP_{1-y}$, where v ranges from greater than 0 to less than 1; and quaternary compound semiconductors include semiconductors with empirical formula $In_xGa_{1-x}As_yP_{1-y}$, where both x and y independently range from greater than 0 to less than 1. Other types of suitable compound semiconductors include II-VI materials, where II and VI represent elements in the IIb and VIa columns of the periodic table. For example, CdSe, ZnSe, ZnS, and ZnO are empirical formulas of exemplary binary II-VI compound semiconductors. Other II-VI semiconductor materials can be used.

The mobile dopants in a semiconductor-based primary active layer 302 can be p-type impurities, which are atoms that introduce vacant electronic energy levels called "holes" to the electronic band gaps of the active region. These dopants are also called "electron acceptors." The mobile dopants can be n-type impurities, which are atoms that introduce filled electronic energy levels to the electronic band gap of the active region. These dopants are called "electron donors." For example, boron (B), Al, and Ga are p-type dopants that introduce vacant electronic energy levels near the valence band of Si; and P, As, and Sb are n-type dopants that introduce filled electronic energy levels near the conduction band of Si. In III-V compound semiconductors, column VI dopants substitute for column V sites in the III-V lattice and serve as n-type dopants, and column II dopants substitute for column III atoms in the III-V lattice to form p-type dopants.

FIG. 8 shows a memristor device 800 configured in accordance with embodiments of the present invention. The device 800 is analogous to the device 500 except the device 800 includes a first alloy electrode 802. In this embodiment, the primary active layer 804 is composed of a semiconductor, and the alloy electrode 802 can be formed by co-deposition of the metal and a semiconductor dopant denoted by "D," or the dopant can be implanted. The dopant can have concentrations in excess of about $10^{15}$ dopants/cm$^3$ while more heavy doping of the alloy electrode 802 can have dopant concentrations in excess of about $10^{19}$ dopants/cm$^3$. After the alloy electrode 802 is formed, the dopants located near interface 806 diffuse a short distance into the primary active layer 804 creating a relatively high concentration of dopants within a region 808 adjacent to the alloy electrode 802. The region 808 corresponds to the secondary active layer of an active region 810.

FIG. 9 shows a memristor device 900 configured in accordance with embodiments of the present invention. The device 900 is analogous to the device 800 except the semiconductor dopants are implanted within the semiconductor-based primary active layer 804 forming a region 902. The region 902 corresponds to the secondary active layer of an active region 904.

IV. Nanowire Implementations

Figure 10:
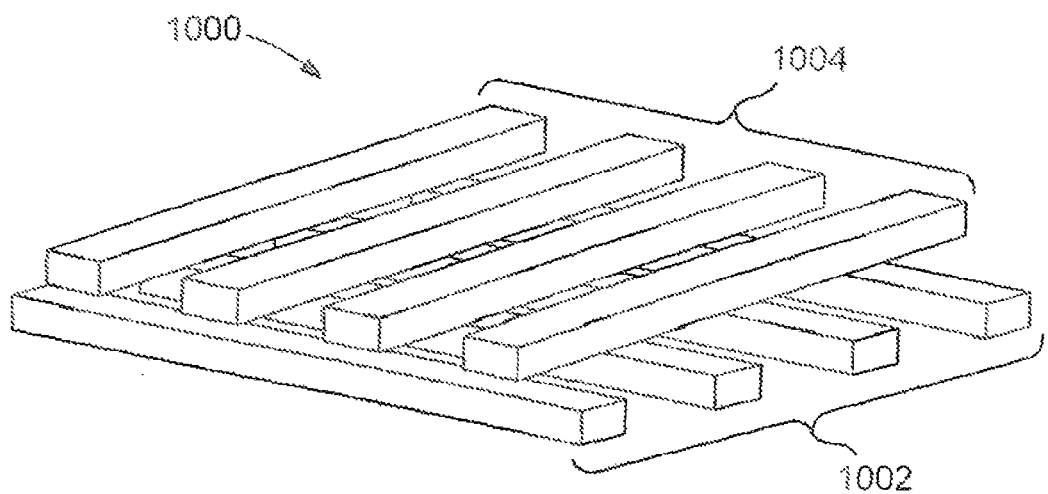
FIG. 10 shows an isometric view of a nanowire crossbar array configured in accordance with embodiments of the present invention.

The memristor devices 500, 600, 700, 800, and 900 can be implemented at nanowire intersections of nanowire crossbar arrays. FIG. 10 shows an isometric view of a nanowire crossbar array 1000 configured in accordance with embodiments of the present invention. The crossbar array 1000 is composed of a first layer of approximately parallel nanowires 1002 that are overlain by a second layer of approximately parallel nanowires 1004. The nanowires of the second layer 1004 are approximately perpendicular, in orientation, to the nanowires of the first layer 1002, although the orientation angle between the layers may vary. The two layers of nanowires form a lattice, or crossbar, each nanowire of the second layer 1004 overlying all of the nanowires of the first layer 1002 and coming into close contact with each nanowire of the first layer 1002 at nanowire intersections that represent the closest contact between two nanowires.

Although individual nanowires in FIG. 10 are shown with rectangular cross sections, nanowires can also have square, circular, elliptical, or more complex cross sections. The nanowires may also have many different widths or diameters and aspect ratios or eccentricities. The term "nanowire crossbar" may refer to crossbars having one or more layers of sub-microscale wires, microscale wires, or wires with larger dimensions, in addition to nanowires. The layers can be fabricated by mechanical nanoimprinting techniques, photolithography, and electron beam lithography. Alternatively, nanowires can be chemically synthesized and can be deposited as layers of approximately parallel nanowires in one or more processing steps, including Langmuir-Blodgett processes. Other alternative techniques for fabricating nanowires may also be employed. Thus, a two-layer nanowire crossbar comprising first and second layers, as shown in FIG. 10, can be manufactured by any of numerous relatively straightforward processes. Many different types of conductive and semiconductive nanowires can be chemically synthesized from metallic and semiconductor substances, from combinations of these types of substances, and from other types of substances. A nanowire crossbar may be connected to microscale address-wire leads or other electronic leads, through a variety of different methods in order to incorporate the nanowires into electrical circuits. At nanowire intersections, nanoscale electronic components, such as resistors, and other familiar basic electronic components, can be fabricated to interconnect two overlapping nanowires. Any two nanowires connected by a device is called a "crossbar junction."

Figure 11:
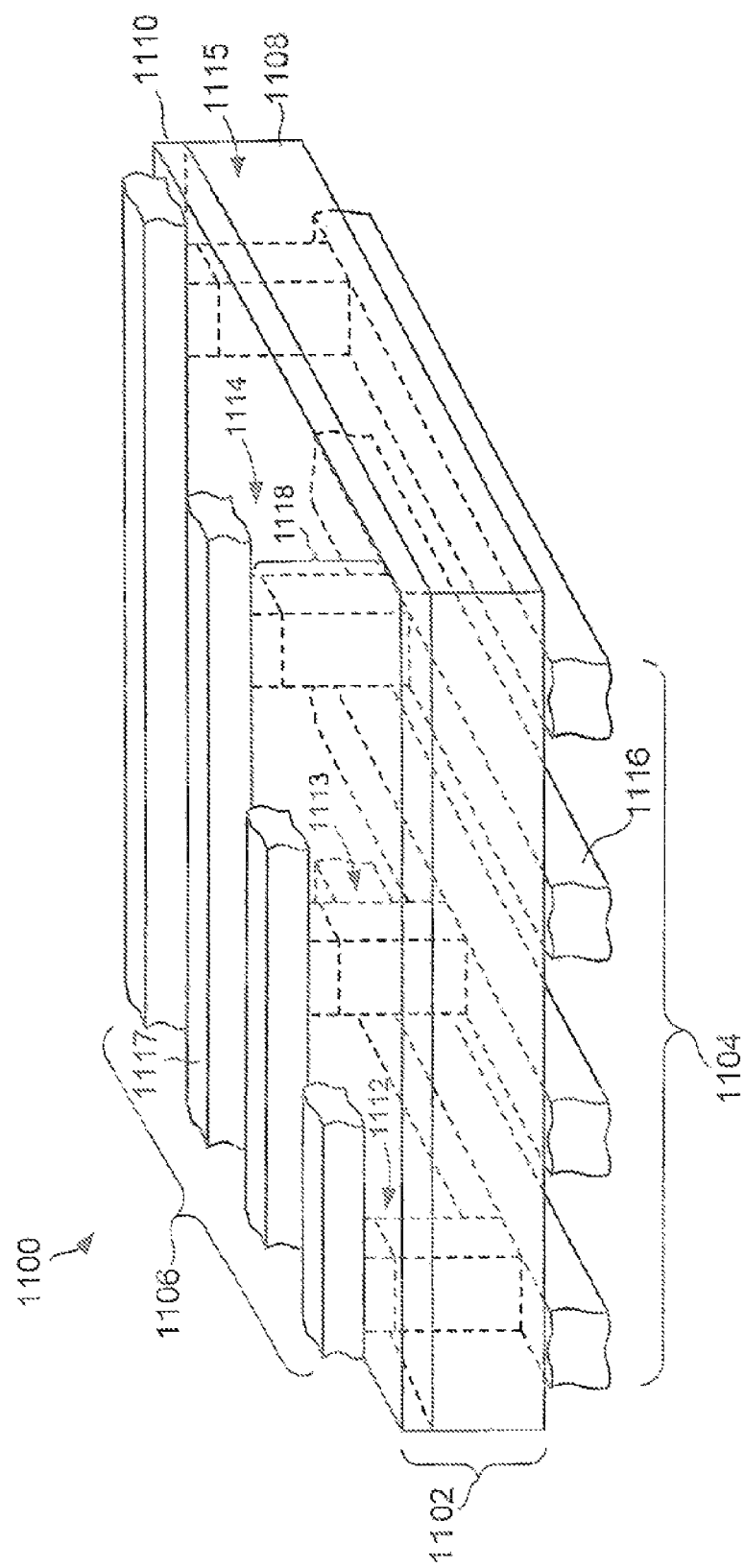
FIG. 11 shows an isometric view of a nanowire crossbar revealing devices located at intersection of a crossbar configured in accordance with embodiments of the present invention.

FIG. 11 shows an isometric view of a nanowire crossbar 1100 revealing an intermediate layer 1102 disposed between a first layer of approximately parallel nanowires 1104 and a second layer of approximately parallel nanowires 1106 in accordance with embodiments of the present invention. The layer 1102 is composed of sub-layers 1108 and 1110. The sub-layer 1108 can be composed of an undoped primary active material, and the sub-layer 1110 can be composed of a doped secondary active material, respectively. The material comprising the layer 1102 and dopants are selected as described in subsection III to form devices 1112-1115 at each nanowire intersection. The nanowires can be composed of suitable metal of semiconductor materials and serve as electrodes. For example, sub-layer 1108 can be composed of $TiO_2$, a relatively thin sub-layer 1110 composed of $TiO_{2-x}$, where oxygen vacancies in the sub-layer 1110 are dopants formed as described above with reference to FIGS. 5-9, and the nanowires in the layers 1104 and 1106 can be composed of Pt. The device 1114 comprises a nanowire 1116 in the first layer 1104, a nanowire 1117 in the second layer 1106, and a region 1118 within the layer 1102 between the nanowires 1116 and 1117. Each of the devices 1112-1115 can be operated separately to produce the forward, reverse, shunted, and head-to-head rectifiers described above with reference to FIG. 2.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purposes of illustration and description. They are not intended to be exhaustive of or to limit the invention to the precise forms disclosed. Obviously, many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents:

The invention claimed is:

1. A device comprising:
a pair of electrodes; and
an active region sandwiched between a first electrode and a second electrode of the pair, the active region comprising:
  a dopant region selectively formed and positioned within the active region; and
  an M material to interact with a material of the active region to selectively form and position the dopant region within the active region.

2. The device of claim 1 wherein the M material is controllably implanted within the active region to selectively form and position the dopant region.

3. The device of claim 1 wherein the M material is selectively implanted within one or both of the electrodes of the pair to diffuse into the active region, a region of diffused M material in the active region being the dopant region.

4. The device of claim 1 wherein the active region further comprises:

a primary active layer to transport dopants that control the flow of charge carriers through the device; and
a secondary active layer comprising the dopant region to provide a source/sink of dopants for the primary active layer.

5. The device of claim 4 wherein a dopant of the dopant region comprises one or more of an oxygen vacancy, a nitrogen vacancy, a sulfur vacancy, a carbon vacancy, and an anion vacancy.

6. The device of claim 4 wherein a material of the primary active layer is electronically semiconducting, nominally electronically insulating, or weakly ionic conducting.

7. The device of claim 4 wherein the primary active layer comprises a film having an electrical conductivity that is capable of being reversibly changed from a relatively low conductivity to a relatively high conductivity as a function of the dopants drifting into or out of the at least one primary active layer.

8. The device of claim 4 wherein the primary active layer comprises a material selected from the group consisting of titanates, zirconates, haihates, lanthanates, manganites, other suitable alloys of these oxides in pairs or with oxides present together, and compounds of the type $A^{++}B^{4+}O_3^{--}$, where A represents at least one divalent element and B represents at least one of titanium, zirconium, and hafnium.

9. The device of claim 4 wherein the primary active layer comprises a material selected from the group consisting of a semiconducting nitride, a semiconducting halide, an elemental semiconductor, or a compound semiconductor, and wherein the M material comprises one or more of an aliovalent element, a p-type impurity, and an n-type impurity.

10. The device of claim 4 wherein the primary active layer and the secondary active layer comprise one of a nitride, a sulfide, a phosphide or a carbide.

11. The device of claim 1 wherein an interface between an electrode of the pair and the active region is Ohmic-like if the dopant region is adjacent to the interface and the interface is Schottky-like if the dopant region is positioned away from the interface.

12. A crossbar comprising:
a first layer comprising substantially parallel nanowires;
a second layer comprising substantially parallel nanowires overlaying the first layer; and
at least one nanowire intersection comprising the device of claim 1,
wherein the first electrode comprises a nanowire of the first layer and the second electrode comprises a nanowire of the second layer.

13. The crossbar of claim 12 wherein either the substantially parallel nanowires of the first and second layers comprise a metal or the substantially parallel nanowires of the first layer comprise a semiconductor and the substantially parallel nanowires of the second layer comprise a metal.

14. A method of forming a memristive device, the method comprising:
providing an active material sandwiched between a first electrode and a second electrode of a pair of electrodes; and
implanting an M material one or both of into the active material and into an electrode of the pair, the M material interacting with a portion of the active material to form a dopant region that is selectively positioned between the pair of electrodes within the active material,
wherein the dopant region comprises a dopant, movement of the dopant within the active material to control a flow of charge carriers through the memristive device.

15. The method of claim 14, wherein the M material interacting with the active material portion forms a vacancy region having relatively higher vacancies within the active material portion, the vacancy region being the dopant region and the vacancies being the dopant.

16. The method of claim 14, wherein the M material interacting with the active region material portion reduces vacancies in the portion of the active material, the dopant region comprising another portion of the active region in which the vacancies are not reduced.

17. The method of claim 14, wherein implanting an M material comprises using ion implantation to implant the M material.

18. The method of claim 14, wherein implanting an M material comprises selectively implanting the M material within one or both of the first electrode and the second electrode, the method further comprising diffusing the M material into the active material to interact with the active material portion and to form the dopant region adjacent to one or both of the first electrode and the second electrode.

19. The method of claim 14, wherein the active material comprises a semiconductor and the M material comprises a semiconductor dopant that is mobile within a lattice of the semiconductor of the active material, the semiconductor dopant comprising one or more of an aliovalent element, a p-type impurity and an n-type impurity.

20. The method of claim 14, wherein the active material comprises one or more of an oxide, a nitride, a sulfide and a carbide, and the M material comprises one or more of a non-oxygen portion of the oxide, a non-nitrogen portion of the nitride, a non-sulfur portion of the sulfide and a non-carbon portion of the carbide, the dopant comprising one or more of an oxygen vacancy, a nitrogen vacancy, a sulfur vacancy and a carbon vacancy in the active material.

\* \* \* \* \*

UNITED STATES PATENT AND TRADEMARK OFFICE
CERTIFICATE OF CORRECTION

PATENT NO. : 8,455,852 B2
APPLICATION NO. : 13/142583
DATED : June 4, 2013
INVENTOR(S) : Nathaniel J. Quitoriano et al.

It is certified that error appears in the above-identified patent and that said Letters Patent is hereby corrected as shown below:

In the Claims:

In column 14, line 18, in Claim 7, after "of the" delete "at least one".

In column 14, line 22, in Claim 8, delete "haihates," and insert -- hafnates, --, therefor.

Signed and Sealed this
Fifteenth Day of October, 2013

Teresa Stanek Rea
*Deputy Director of the United States Patent and Trademark Office*